United States Patent [19]
Schreiber et al.

[11] Patent Number: 5,306,546
[45] Date of Patent: Apr. 26, 1994

[54] MULTI CHIP MODULE SUBSTRATE

[75] Inventors: Christopher M. Schreiber, Newport Beach; Haim Feigenbaum, Irvine; Harold C. Bowers, Rancho Palos Verdes, all of Calif.

[73] Assignee: Hughes Aircraft Company, Los Angeles, Calif.

[21] Appl. No.: 994,802

[22] Filed: Dec. 22, 1992

[51] Int. Cl.⁵ .................................................. B32B 9/00
[52] U.S. Cl. ..................................... 428/210; 428/209; 361/718; 257/714
[58] Field of Search ..................... 361/386; 257/714; 428/209, 210

[56] References Cited

U.S. PATENT DOCUMENTS

| | | | |
|---|---|---|---|
| 4,377,316 | 3/1983 | Ecker et al. | 339/17 |
| 4,652,970 | 3/1987 | Watari et al. | 257/714 |
| 4,744,007 | 5/1988 | Watari et al. | 257/714 |
| 5,189,505 | 2/1993 | Bartelink | 257/419 |

Primary Examiner—Patrick J. Ryan
Assistant Examiner—Kam F. Lee
Attorney, Agent, or Firm—Elizabeth E. Leiterge; Terje Gudmestad; W. K. Denson-Low

[57] ABSTRACT

A multi-level substrate (24) for mounting and interconnecting a number of integrated circuit chips (10) is formed of a stack of laminated sheets each comprising a conductive circuit layer (30,34,38,42,46) is laminated to a dielectric film (32,36,40,44,48). The sheets are formed by fully additive or semi-additive processes on a reusable mandrel and are interconnected to one another by raised features (78) on the circuit layer of one sheet that project through a hole (86) in the dielectric film of an adjacent sheet to contact a receiving area (88) of the circuit layer of the adjacent sheet. Integrated circuit chips (10) and other electrical components are mounted to the uppermost sheet and electrically connected thereto by means of wiring bonding (16) or a f lip-chip arrangement (150) in which chip pads (148) rest upon and contact raised features (146) of the circuit layer (140) of the uppermost sheet.

9 Claims, 2 Drawing Sheets

MULTI CHIP MODULE SUBSTRATE

BACKGROUND OF THE INVENTION

1. Field of the Invention

The present invention relates to multi chip integrated circuit module assemblies, and more particularly concerns an improved arrangement for mounting and interconnecting a plurality of integrated circuit chips or other components to provide a multi-level interconnection substrate module.

2. Description of Related Art

High density packaging of multiple integrated circuits and other electronic components requires a multi-level substrate so that the very high density of interconnecting circuit traces which are required for interconnecting chips and components with one another may be accomplished at different levels to avoid crossing of conductive leads. Manufacture of such multi-level substrates using conventional thin film techniques has a number of disadvantages. Conventional multi-level substrate processing frequently comprises a sequential process in which one thin film circuit is laid down upon and formed over an earlier formed circuit with suitable dielectric layers to isolate the several thin film circuit layers from one another. Such substrates may employ as many as five or more layers, each of which, excepting only the last, effectively forms a base upon which the next layer is constructed. The multi layer substrate, therefore, can be effectively tested only after completion of all of its layers. This may be expensive because many well made layers of a simple module may have to be discarded if a final layer is found to be faulty, or one may continue to add value to a faulty product.

Conventional thin film processes frequently use processes that have a number of disadvantages. Dimensional precision is difficult to achieve. The use of various etching, stripping and cleaning fluids requires special handling of hazardous chemicals. Techniques for disposal of the resulting effluents are complex and expensive and subject to strict government controls. Etched circuit processing has a relatively low yield, greatly increasing the cost of processing, which inherently involves a large number of costly steps.

Still other problems involve mounting of integrated circuit chips on multi-level circuit substrates, which often is carried out by means of wire bonding, tape automated bonding (TAB) or use of solder balls. These procedures entail difficult, complex and time consuming operations and require relatively large substrate surface areas, which limits density of chip and component packaging. Flip-chip mounting is one method for increasing chip density. In flip-chip mounting of integrated circuit chips a bump or raised feature is formed on the chip pads and the chip is mounted upside down with its bumps electrically contacting its substrate. Although flip-chip mounting is desirable, the acquisition and production of chips with bumps is difficult and expensive. The bumps are generally applied to the chip pads after completion of manufacture of the chips. However, the process of forming bumps on the chip pads may result in unacceptable damage to or destruction of the chips.

Accordingly, it is an object of the present invention to provide for mounting and interconnection of integrated circuit chips or other electrical components by processes and structures that avoid or minimize above mentioned problems.

SUMMARY OF THE INVENTION

In carrying out principles of the present invention in accordance with a preferred embodiment thereof, a multi component module substrate is formed of a plurality of laminated sheets each comprising a conductive circuit layer having first and second sides and a dielectric substrate laminated to the conductive circuit layer. The conductive circuit layer includes a plurality of bumps projecting from the first side and a number of contact receiving areas on the second side. The receiving areas are aligned with holes in the dielectric layer. The circuit layer is laminated to its dielectric film to form one sheet and several sheets are stacked and laminated to each other with the raised features of the circuit layer of one sheet projecting through holes in the dielectric film of an adjacent sheet to contact the receiving area of the circuit layer of the adjacent sheet.

According to one feature of the invention, the conductive circuit layer and the dielectric film of each sheet are formed on and laminated together on a mandrel and removed therefrom for subsequent lamination to other similarly formed sheets. This enables a modular construction in which the electrical integrity of each separately formed sheet can be tested before it is assembled to other sheets.

According to another feature of the invention, the raised features on an outermost one of the multiple sheets are configured and arranged to enable a flip-chip mounting by placing the conductive pads of an integrated circuit chip on the upper ends of the raised features.

DESCRIPTION OF THE PREFERRED EMBODIMENTS

Figure 1:
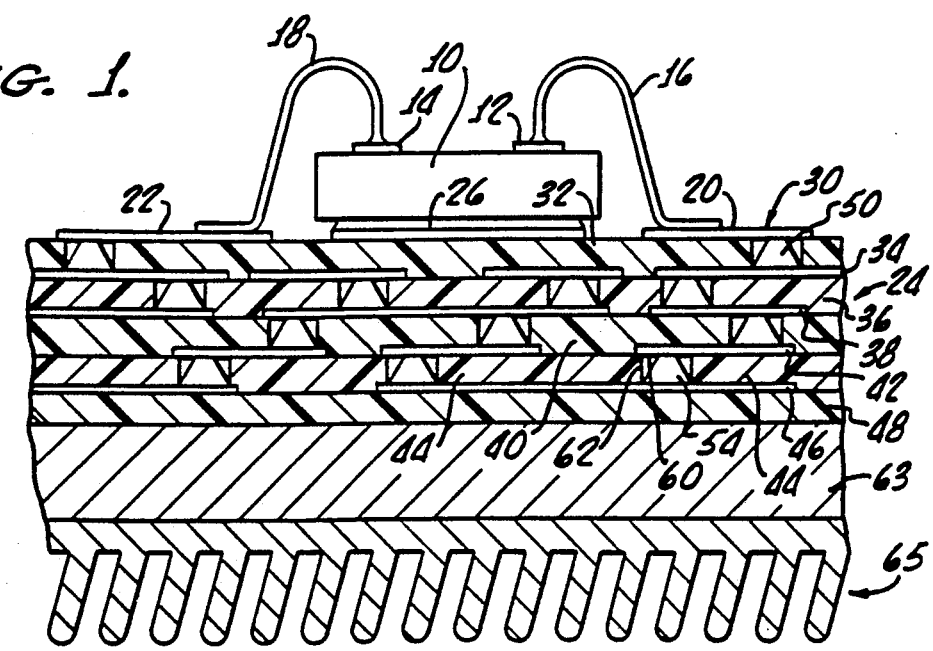
FIG. 1 is a sectional fragmentary view of a multi-level substrate mounting an integrated circuit chip.

As shown in FIG. 1, an integrated circuit chip 10 having conductive pads 12,14, is electrically connected by wire bonds 16,18 to conductive areas 20,22 of a first laminated sheet of a multi sheet substrate, generally indicated at 24. The chip 10 is physically secured to the substrate by means of a non-conductive adhesive 26.

This multi-sheet substrate 24 is formed of a plurality of independently formed laminated sheets, each of which is formed of a conductive circuit layer, such as layer 30, laminated to a dielectric film 32. The multi-sheet substrate includes a plurality of additional laminated sheets which may substantially identical to the first laminated sheet 30,32. A second sheet in the stack of laminated sheets includes a circuit layer 34 and a dielectric film 36. The next laminated sheets are formed of circuit layer 38 and dielectric film 40, and the conductive circuit layer 42 and its dielectric film 44. The bottom sheet comprises circuit 46 and dielectric film 48. The several independently formed laminated sheets are stacked upon one another and interconnected both physically and electrically, as will be described more particularly below. The multi-sheet substrate 24 of FIG. 1 includes a base of alumina 63 which is mounted on a heat sink 65. Although the drawings are not to scale, the module vicinity layers are less than the percent of the thickness of the alumina. The heat sink helps to remove heat from the substrate module while the alumina base provides a coefficient of temperature expansion (CTE) closely matched to that of the integrated circuit chip. This allows use of more generic (low cost) dielectric materials which have a poor CTE match to the IC's. Since the dielectric is somewhat flexible and has a thickness less than ten percent of the alumina thickness, the alumina constrains the dielectric during thermal cycling.

Each of the conductive circuit layers, except in this embodiment, only the uppermost circuit layer 30, is formed with a plurality of raised features, such as the bump 50 of circuit layer 34. These bumps are employed to interconnect the circuit layer of one laminated sheet with the circuit layer of an adjacent laminated sheet. For example, the lowermost laminated sheet, including circuit layer 46, has a plurality of bumps, generally indicated at 54, which are connected to the adjacent laminated sheet formed of circuit layer 42 and dielectric film 44. The raised feature of each circuit layer, such as, for example, raised feature 54 of circuit layer 46, electrically connects to a receiving area 60 on the lower side of the circuit 42 of the adjacent laminated sheet, as will be described in detail below. The dielectric film 44 of such laminated sheet is formed with a hole 62 positioned to match the position of the raised feature 54 of the adjacent laminated sheet 46,48, and this raised feature 54 is received in the hole 62 of the dielectric film of the adjacent layer so as to contact the receiving area formed on the underside of the circuit layer 42.

Conveniently, each laminated sheet, formed of its conductive circuit layer and dielectric film, is manufactured individually by semi-additive or fully additive forming processes of the type described in any one of several co-pending applications. These several co-pending applications include U.S. Pat. application Ser. No. 580,758 filed Sep. 11, 1990 for Three Dimensional Electroformed Circuitry, of William R. Crumly Christopher M. Schreiber and Haim Feigenbaum; Ser. No. 07/580,749, filed Sep. 11, 1990, for Laser Pattern Ablation of Fine Line circuitry Masters, of Christopher M. Schreiber and William R. Crunly; Ser. No. 07/580,748, filed Sep. 11, 1990, for Apparatus and Method Using a Permanent Mandrel for Manufacture of Electrical Circuitry, of Mark A. Souto and Christopher M. Schreiber; and Ser. No. 07/674,254, filed Mar. 25, 1991 for Interconnection of Opposite Sides of a Circuit Board, of Christopher M. Schreiber, William R. Crunly and Robert B. Hanley. These applications are all assigned to the assignee of the present application, and the disclosure of each is incorporated herein by this reference as though fully set forth. These applications describe various aspects of additive forming of thin film circuitry on a reusable mandrel. Thus, application Ser. No. 580,758 for Three Dimensional Electro formed Circuitry describes the use of a stainless steel mandrel having a number of depressions therein and a pattern of non-conductive material on its surface so that a circuit pattern of conductive traces may be electroplated or otherwise electroformed on the exposed mandrel surface, including the depressions. A dielectric film is laminated to the circuit pattern on the mandrel before the circuit and film are removed from the mandrel as a unitary laminated sheet. The electroplated mandrel depressions form raised features or bumps on the resulting laminated sheet, which project from the plane of the circuit.

In application Ser. No. 07/580,749 Laser Pattern Ablation of Fine Line Circuitry Masters, a stainless steel mandrel having depressions is coated with Teflon, which is laser ablated to define a pattern of a desired circuit, including the mandrel depressions, to form raised circuit features. The circuit is then additively electroformed on the exposed areas of the mandrel, including its depressions, and, after laminating a dielectric film to the circuit, the film and circuit are removed as a unitary laminated sheet from the mandrel.

In application Ser. No. 07/674,254 for Interconnection of opposite Sides of a Circuit Board, either a raised feature or depression is formed in the mandrel, which bears a non-conductive pattern, and the electroplated raised features are arranged to extend through a laminated dielectric substrate so as to accomplish electrical interconnection from a circuit on one side of a dielectric substrate to a circuit on the other side.

In application Ser. No. 07/580,748 for Apparatus and Method Using a Permanent Mandrel for Manufacture of Electrical Circuitry thin flexible laminates are formed of a dielectric substrate having an electrical circuit formed by conductive traces bonded thereto.

Figure 2:
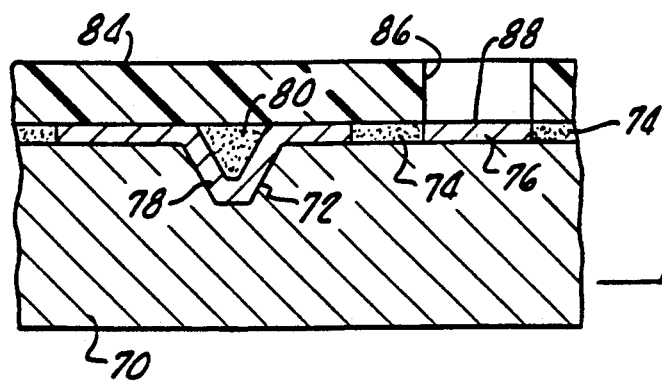
FIG. 2 illustrates certain steps in one method of fabrication of a single laminated sheet of circuit layer and dielectric film upon a reusable mandrel.

Although techniques described in any of the above-identified applications may be employed to manufacture the laminated sheets of the multi-level substrate described herein, for purposes of exposition FIG. 2 illustrates one method that may be employed. In the arrangement illustrated in FIG. 2 a stainless steel mandrel 70 is formed with a depression 72 in one surface and has applied to such surface a pattern of a non-conductive material, such as Teflon 74, that defines a pattern of exposed mandrel surface, including the depression 72. The mandrel is immersed in an electroplating bath to deposit conductive circuitry 76, formed of copper, for example, including a raised feature 78 plated in depression 72. If deemed necessary or desirable, the hollow area formed within the raised feature 78 may then be filled with a suitable electrically non-conductive rigidifying and stiffening epoxy 80, which is cured in place. Thereafter a thin film of dielectric 84, which may be a polyamide for example, is adhesively or otherwise bonded to the circuit 76 to form the laminated sheet 76,84. The laminated sheet 76,84 is then removed from the mandrel as a unit, leaving the mandrel with its Teflon pattern to be cleaned and available for reuse to form another laminated sheet of conductive circuitry and dielectric film.

Figure 3:
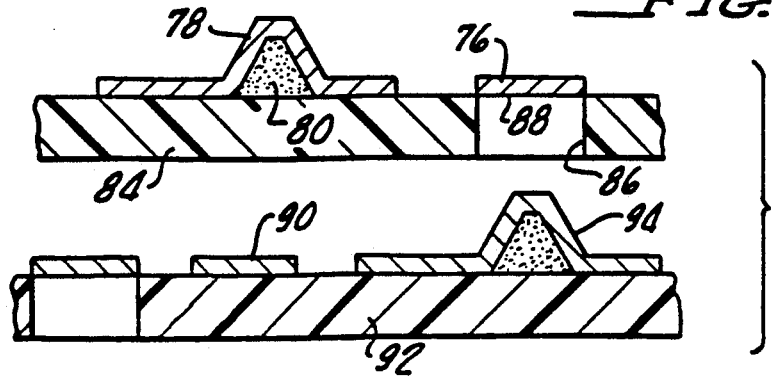
FIG. 3 is an exploded view of first and second laminated sheets prior to lamination to each other.

The dielectric film 84 is predrilled to provide holes 86 that expose receiving areas 88 on the side of the conductive circuit opposite the side from which project the raised features 78. Alternatively, the holes 86 may be formed in the film after laminating the film to the conductive circuit layer. Thus the completed laminated film, when removed from the mandrel, appears as indicated at FIG. 3, including conductive circuitry 76, raised feature 78 and dielectric film 84. Also shown in FIG. 3, in position to be laminated to the first laminated sheet, is a second laminated sheet including conductive circuitry 90 laminated to a dielectric film 92. Circuit layer 90 includes a raised feature 94 that is positioned in alignment with the hole 86 formed in the dielectric film of of sheet 76,84 so that when the sheet 90,92 is laminated to the sheet 76,84 the raised feature 94 extends into and through the hole 86 of the film 84 to contact the receiving area 88 on the surface of conductive circuit layer 76,78.

Figure 4:
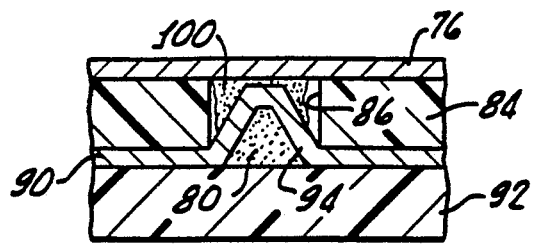
FIG. 4 is a detailed fragmentary illustration of an interconnection between a raised feature of one laminated sheet and the receiving area of a circuit layer of another laminated sheet.

Illustrated in FIG. 4 is a detail showing connection of raised feature 94 of the conductive circuit of one laminated sheet to the receiving area 88 of an adjacent laminated sheet. As shown in FIG. 4 the raised feature 94 projects into and through the hole 86 in film 84 of the adjacent sheet and is electrically connected to the receiving area of conductive circuit layer 76 by use of a metal laden epoxy, such as a silver epoxy 100. Prior to joining of the two laminated sheets, hole 86 is partly filled with a quantity of the conductive epoxy, which may be in a partly cured or B stage condition. Upon lamination of the two sheets to one another, and upon application of heat and pressure, the body of epoxy flows in and around the raised feature and over the remaining surface of the receiving area of circuit 76 to fill or substantially fill the hole 86, where it is cured in place to reliably interconnect the raised feature 94 with the receiving area of circuit 76 in a permanent manner.

Also illustrated in FIG. 4 is a quantity of the non-conductive rigidifying epoxy 80 that fills the cavity behind the raised feature 94. Use of this rigidifying epoxy is optional, depending upon the dimensions of the raised feature and other components and the magnitude of pressures to be applied. In an exemplary embodiment the conductive circuit layer has a thickness of approximately 0.0005 inches, and the dielectric film a thickness of approximately 0.001 inches. Each raised feature has a dimension in the plane of the circuit of approximately 0.004 inches at its base and has a height substantially equal to the thickness of the conductive film. The raised feature may have a height slightly less than the thickness of the dielectric film, with the difference being taken up by the interposed conductive epoxy. It will be understood that the several laminated sheets are identical to each other, being identically made, except for the pattern and configuration of the circuit and the several raised features and corresponding holes in the dielectric films. Because the circuits and raised features of each sheet are different, the bumps of the different sheets are not in vertical registration with each other, but, instead, are staggered from one sheet to the next.

In the manufacture of a typical substrate employing the arrangements described above, a plurality of laminated sheets are independently fabricated in the manner described, with each sheet being identical to the other except for the difference in pattern and locations of its circuit raised features. The uppermost or first laminated sheet 30,32 is different in that it has no raised features but only areas configured and located for attachment of the integrated circuit chip and other components thereto. After manufacture of each laminated sheet, each sheet is individually tested to verify its electrical integrity. The several sheets then are mounted one atop the other to cause the raised features of one sheet to enter the holes of the adjacent sheet after the holes have been filled or partly filled with a conductive epoxy. Alternately, a drop of conductive epoxy may be placed on top of each raised feature so as to contact the receiving area of the conductive circuit of the next sheet when the several sheets are stacked together. In stacking the sheets use is made of alignment holes and/or alignment pins (not shown) that are inserted through the sheets in peripheral edges thereof to ensure reception of each of the raised features of one sheet in the dielectric film holes of an adjacent sheet. The assembly is then subjected to heat and pressure to cure the conductive epoxy and thereby solidify the multi-level substrate. If deemed necessary or desirable, thin layers of adhesive may be applied to the individual laminated sheets prior to assembly to ensure a more reliable attachment of the several sheets to one another.

Figure 5:
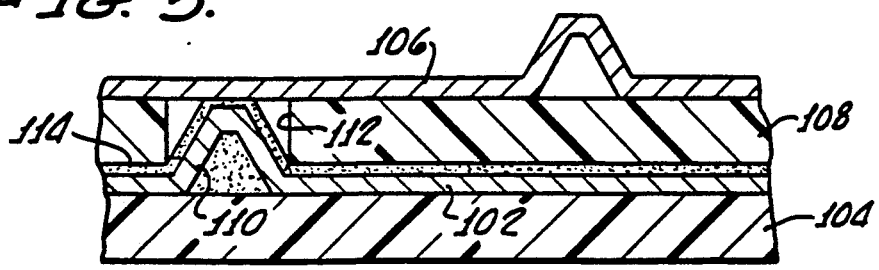
FIG. 5 illustrates an alternate arrangement for electrically interconnecting the raised feature of one sheet to the receiving area of the circuit layer of an adjacent sheet.

FIG. 5 illustrates an alternate arrangement for ensuring electrical contact between each raised feature and the receiving area of the adjacent laminated sheet. In this arrangement a first laminated sheet, including a conductive circuit 102 and a dielectric film 104, is laminated to a second laminated sheet comprising a conductive circuit 106 and a dielectric film 108. Circuit layer 102 includes a raised feature 110 which is received in a hole 112 formed in the dielectric film 108 of the upper of the two illustrated layers. Interposed between the two laminated sheets, and, specifically, between the dielectric film 108 of the upper sheet and the electrically conductive circuit layer 102 of the lower sheet, is a thin layer 114 of an anisotropic film, also termed a "Z axis'-'adhesive. The film is basically a non-conductive adhesive carrying a number of small electrically conductive spheres or particles of other shape which are so positioned that when the film is compressed in a first or "Z axis" direction the particles will make contact with each other and with the exterior of the film along such "Z axis", but will not make contact with each other in any direction perpendicular to such axis. Thus, when the Z axis film 114 is applied to, for example, the lower side of the dielectric film 108 and the second laminated sheet 102,104 is pressed against the anisotropic film, the raised feature 110 presses this film further into the hole 112 in film 108 and against the receiving area on the lower side of circuit layer 106 to thereby provide electrical conduction between the upper end of the feature 110 and the receiving area on the lower side of circuit 106 (as viewed in FIG. 5).

Figure 6:
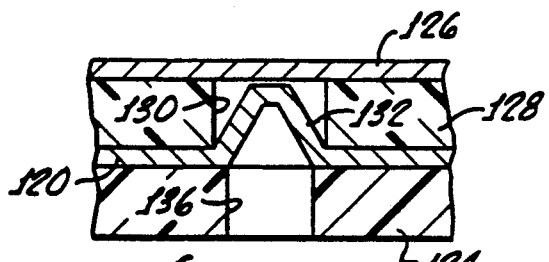
FIG. 6 illustrates the juxtaposition of two laminated sheets in preparation for laser welding of the circuit layers of the two sheets.

Still another alternate method of interconnecting the raised features of one laminated sheet with the receiving areas of an adjacent laminated sheet is illustrated in FIGS. 6 an 7. FIG. 6 illustrates a first laminated sheet comprising circuit layer 120 and a dielectric film 124 that has been laminated thereto on the mandrel upon which the circuit layer 120 is formed as described above. Connection of this laminated sheet 120,124 is to be made to a second laminated sheet comprising a conductive circuit layer 126 and its dielectric film 128. Dielectric film 128 includes a hole 130, as described in above mentioned embodiments, for reception of a raised feature 132 of circuit layer 120. The upper end of raised feature 132 may contact or be closely adjacent to the receiving area on the lower surface (as viewed in FIG.

Figure 7:
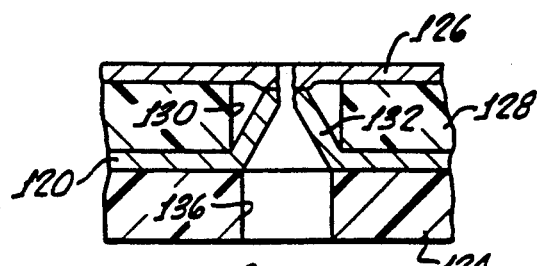
FIG. 7 illustrates the completed welded interconnection of the circuit layers of the two laminated sheets.

6) of the circuit layer 126. Dielectric film 124 of the lower laminated sheet is formed with an additional hole 136 that is used for transmission of a welding laser beam and also for ease in visually positioning the laser beam. The two laminated sheets are positioned as illustrated in FIG. 6, and a laser is employed to weld the two circuits together. For example, a YAG laser operated at about 135 watts with a single 0.5 millisecond pulse providing an output power of about 3 joules is employed and is sufficient to melt and vaporize adjoining parts of the raised feature 132 and the receiving side of the conductive circuit 126 of the upper laminated sheet. The welding of the raised feature physically and electrically interconnects this feature with the circuit layer of the other sheet, resulting in a solid interconnection, both physical and electrical, as is illustrated in FIG. 7.

Figure 8:
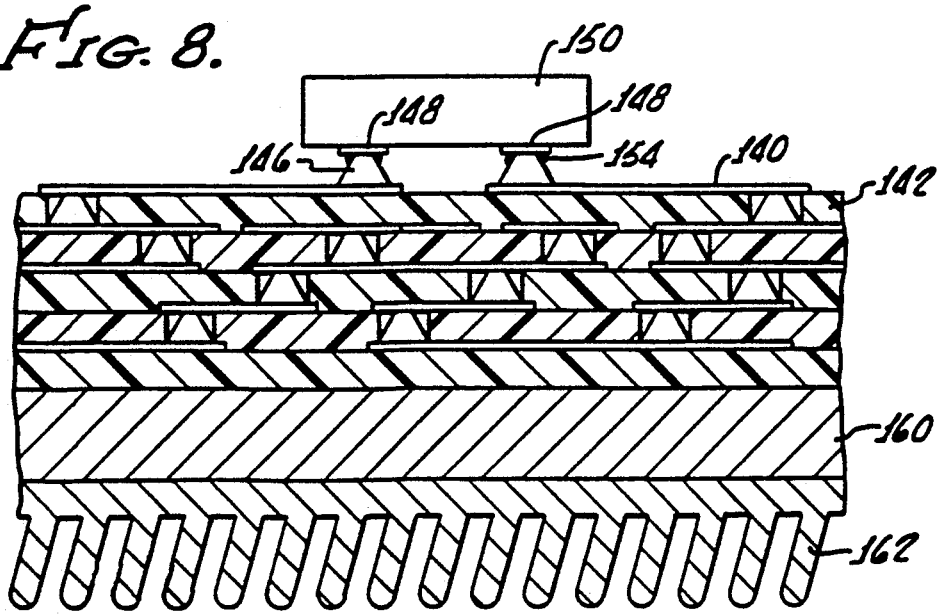
FIG. 8 illustrates a flip-chip mounting to a multi-layer substrate.

Illustrated in FIG. 8 is a multi-level substrate that may be identical to any of the multi-level substrates described above, but in which the uppermost laminated sheet, comprising a conductive circuit layer 140 and a dielectric film 142 are modified. More specifically, the conductive circuit 140 is modified to provide a group of raised features 146 that are configured and arranged in a pattern that precisely matches the configuration and arrangement of the pattern of conductive pads 148 on the surface of an integrated circuit chip 150. The latter is positioned upside down, that is, with its conductive pads 148 facing the substrate 140,142, and is aligned so that its conductive pads are in registration with respective ones of the group of raised features 146 of the uppermost conductive circuit layer 140 of the substrate. A small quantity of conductive adhesive 154 is applied to the upper end of each of the raised features 146, and the chip is pressed against the substrate under suitable pressure and temperature to cure and solidify the partly cured conductive epoxy. In the arrangement illustrated in FIG. 8 the raised features 146 may have a height greater than the height of the raised features of other levels of the substrate in order to ensure proper positioning and spacing of the chip 150 above the substrate. For example, for mounting a chip in the flip-chip arrangement of FIG. 8, the raised features 146 may have a height of 0.004 inches. It is the height of this raised feature that determines the distance by which the chip is spaced above the multi-layer substrate. The arrangement of FIG. 8, like the arrangement of FIG. 1, also includes a plurality of laminated sheets each comprising a conductive circuit layer and a dielectric film which differ only in the configuration of the pattern of the circuit and raised features and dielectric film holes, all being laminated together and mounted on an alumina base 160 and a heat sink 162.

What is claimed is:

1. A multi component module substrate comprising:
  a plurality of independently formed laminated sheets, each sheet comprising:
    an electrically conductive circuit having first and second sides and a plurality of conductive circuit traces,
    a plurality of projecting features integral with said traces and projecting from the first side of each of said circuits,
    a plurality of contact receiving areas on the second side of each of said circuits, and
    a dielectric film laminated to said circuit and having holes aligned with receiving areas of an adjacent circuit,
  said sheets being laminated together with the projecting features of each sheet projecting through a hole in the dielectric film of adjacent layer, and
  means for electrically connecting said projecting features with said receiving areas, the projecting features of one sheet projecting from the circuit traces of such sheet by a distance substantially equal to the thickness of the dielectric film of an adjacent sheet, whereby the circuit traces and projecting features of the sheet are directly connected only to receiving areas of the circuit of an adjacent sheet.

2. The module substrate of claim 1 including a layer of Z axis adhesive interposed between said sheets.

3. The module substrate of claim 1 including a body of an electrically conductive adhesive in at least one hole of one of said dielectric films, said adhesive being in contact with the receiving area exposed by such hole and the projecting bump of an adjacent sheet positioned in such hole.

4. The module substrate of claim 1 wherein the dielectric film of each sheet has a plurality of holes aligned with respective ones of the projecting features of such sheet for transmission of a laser welding beam, and wherein each said projecting feature projecting into a hole in the dielectric film of an adjacent sheet is welded to the receiving area of the circuit of such adjacent sheet.

5. The module substrate of claim 1 wherein an outer one of said laminated sheets includes a plurality of outer projecting features projecting outwardly of the substrate, and including an integrated circuit chip having chip contact pads on said chip and aligned with respective ones of said outer projecting features said contact pads being in direct electrical contact with respective ones of said outer projecting features.

6. The module substrate of claim 1 wherein an outer one of said sheets includes a plurality of mounting features projecting outwardly by a predetermined distance, and including an integrated circuit chip having a plurality of contact pads on said chip, said pad being aligned with said mounting features and directly contacting said mounting features to space the chip from said outer sheet by said distance.

7. A multi chip module substrate comprising:
  a plurality of multi layer sheets, each sheet having a conductive circuit and a dielectric film,
  a plurality of projecting features integrally formed on and projecting from one side of each of said conductive circuits, and
  a plurality of receiving areas formed on the other side of each of said conductive circuits,
  each of said dielectric films having formed therein a plurality of holes in registration with receiving areas of the conductive circuit of such sheet, said holes of the dielectric film of one sheet receiving the projecting features of the conductive circuit of an adjacent sheet and conductive means in said holes for electrically interconnecting the projecting features of one sheet with the receiving areas of the conductive circuit layer of an adjacent sheet, said projecting features of one sheet projecting from the circuit of such sheet by a distance substantially equal to the thickness of the dielectric film of an adjacent sheet, whereby the circuit of each sheet is directly connected only to the circuit of an adjacent sheet.

8. The substrate of claim 7 wherein the bumps of each of said multi layer sheets are laterally displaced from all bumps in an adjacent multi layer sheet.

9. The substrate of claim 7 wherein the bumps of one of said multi layer sheets extend into the holes of the dielectric film of an adjacent multi layer sheet and are welded the receiving areas of the conductive circuit of said adjacent multi layer sheet.

* * * * *